United States Patent
Yamamoto et al.

(10) Patent No.: US 7,482,617 B2
(45) Date of Patent: Jan. 27, 2009

(54) OPTICAL SEMICONDUCTOR DEVICE AND FABRICATION METHOD THEREOF

(75) Inventors: Tsuyoshi Yamamoto, Kawasaki (JP); Mitsuru Ekawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 260 days.

(21) Appl. No.: 11/244,387

(22) Filed: Oct. 6, 2005

(65) Prior Publication Data

US 2006/0219996 A1    Oct. 5, 2006

(30) Foreign Application Priority Data

Mar. 31, 2005   (JP) .............................. 2005-102945

(51) Int. Cl.
  *H01L 29/06*   (2006.01)
  *H01L 21/00*   (2006.01)

(52) U.S. Cl. .............................. 257/12; 257/94; 438/39; 438/47

(58) Field of Classification Search .................... 257/12, 257/14, 32, 37, 94; 438/22, 23, 39, 40, 41, 438/46, 47

See application file for complete search history.

(56) References Cited

U.S. PATENT DOCUMENTS 6,256,331 B1 * 7/2001 Kitoh et al. .............. 372/46.01
2005/0189552 A1 * 9/2005 Ikoma et al. .................. 257/94

FOREIGN PATENT DOCUMENTS

JP   8-172241 A   7/1996
JP   2002-134842 A   5/2002

* cited by examiner

*Primary Examiner*—Kevin M Picardat
(74) *Attorney, Agent, or Firm*—Arent Fox LLP

(57) ABSTRACT

In order to prevent As/P replacement at the boundary face of a re-grown semiconductor layer and avoid a crystalline defect caused by the replacement, there is provided an optical semiconductor device comprising: a semiconductor substrate; a striped stacking body including a first semiconductor layer, an active layer, and a second semiconductor layer; and a burying layer burying the striped stacking body striped stacking body, wherein surfaces in contact with a side face and a bottom face of the burying layer are made of a compound semiconductor that contains arsenic (As) alone as a group V element, and a portion other than the surface includes a group V element other than arsenic.

17 Claims, 7 Drawing Sheets

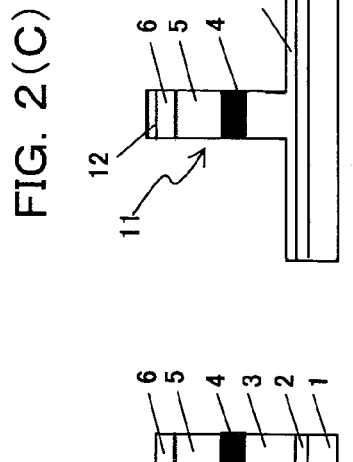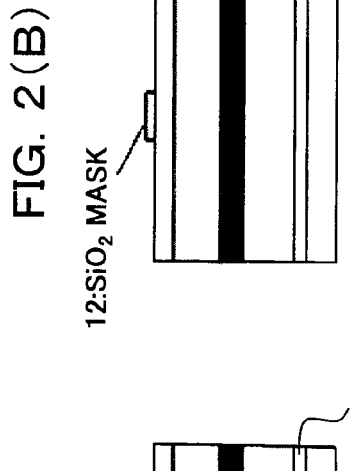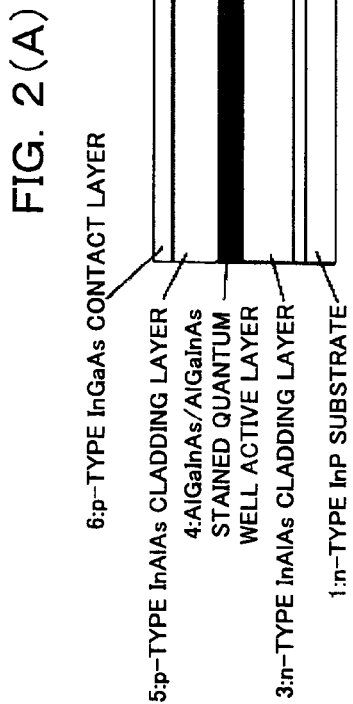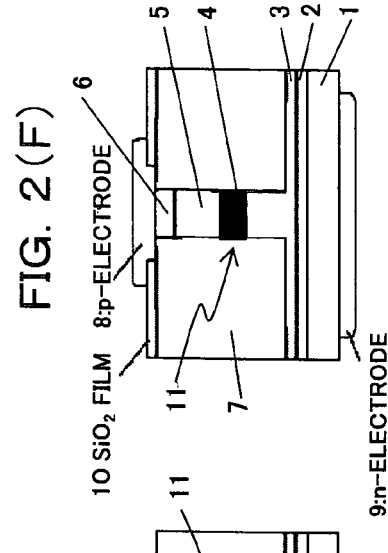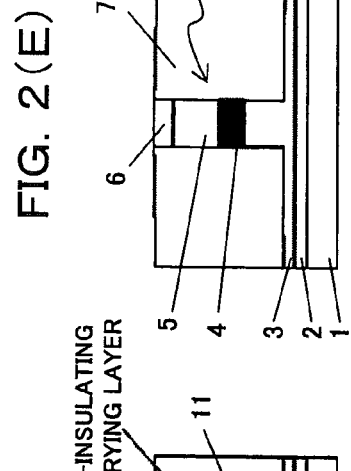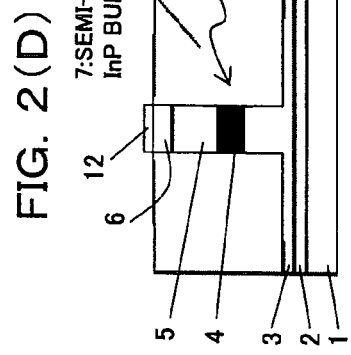

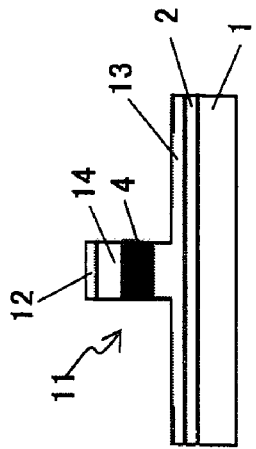 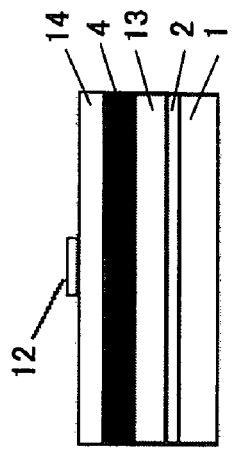 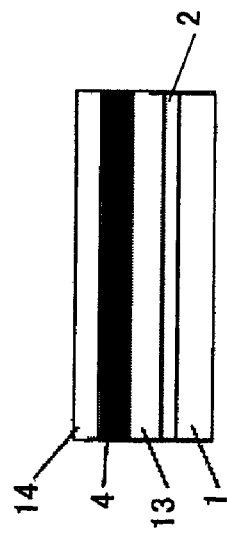
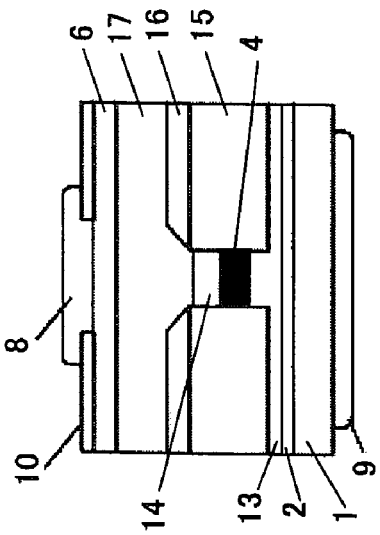 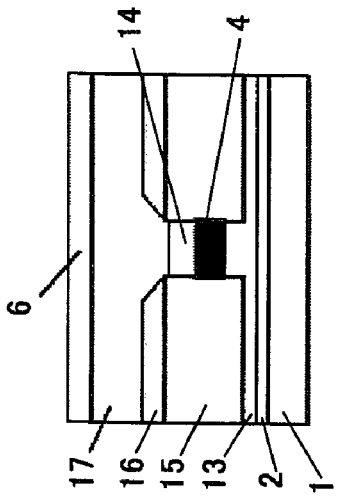 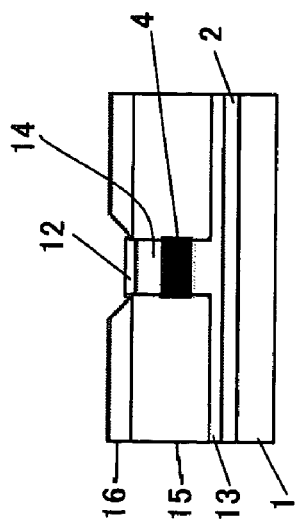
FIG. 4(A)  FIG. 4(B)  FIG. 4(C)
FIG. 4(D)  FIG. 4(E)  FIG. 4(F)

PRIOR ART

RAISING TEMPERATURE IN PH₃ ATMOSPHERE AND THEN GROWING BURYING LAYER

OPTICAL SEMICONDUCTOR DEVICE AND FABRICATION METHOD THEREOF

CROSS REFERENCE TO RELATED APPLICATIONS

This application is based on and hereby claims priority to Japanese Application No. 2005-102945 filed on Mar. 31, 2005 in Japan, the contents of which are hereby incorporated by reference.

BACKGROUND OF THE INVENTION

1. Field of the Invention

The present invention relates to an optical semiconductor device and a fabrication method for the optical semiconductor device, preferably used for optical fiber communication systems and the like.

2. Description of the Related Art

In recent years, in accordance with improvement of optical communication modules smaller in size and lower in electric power consumption, optical devices, such as semiconductor lasers and/or optical modulators, able to operate even at high temperatures are demanded.

Conventional optical devices used for optical fiber communication systems have been made mainly of InGaAsP based materials.

Lately, optical devices made of AlGaInAs based materials that realize sufficient high-speed performance at a high temperature because of their superior band structure of hetero junctions have been developed.

Further, optical devices with buried heterostructure can reduce driving electric current and realize high-speed performance, and therefore have been focused on.

Here, FIG. 6 shows an example of a conventional buried heterostructure semiconductor laser (an optical semiconductor device) configured by AlGaInAs based materials.

A conventional buried heterostructure semiconductor laser made from AlGaInAs based materials, as shown in FIG. 6, includes an optical waveguide formed by sequentially depositing (stacking) an n-type InP lower cladding layer 101 also serving as a buffer layer, an AlGaInAs/AlGaInAs strained multiple quantum well active layer 102, a p-type InP upper cladding layer 103, and a p-type InGaAs contact layer 104 on an n-type InP substrate 100 and by processing the stacking body (the deposited layers) into a mesa shape, and has a structure that the opposite sides of the optical waveguide in a mesa shape are buried with an InP layer (here, a semi-insulating InP layer) 105. In FIG. 6, symbol 106 represents an n-electrode; symbol 107 represents a p-electrode; and symbol 108 represents a $SiO_2$ film (layer)

Several fabrication methods for such a buried heterostructure semiconductor laser are proposed, but a buried heterostructure semiconductor laser is usually fabricated by the following method.

First of all, as shown in FIG. 7(A), the n-type InP lower cladding layer 101 also serving as a buffer layer, the AlGaInAs/AlGaInAs strained multiple quantum well active layer 102, the p-type InP upper cladding layer 103 and the p-type InGaAs contact layer 104 are stacked on the n-type InP substrate by carrying out crystal growth and the stacking body are processed into a mesa shape by etching.

After that, as shown in FIG. 7(B), an InP layer (in this case, a semi-insulating InP layer) is re-grown (formed) on opposite sides of the mesa structure by, for example, the MOCVD method, so that an InP burying layer (here, a semi-insulating InP burying layer) 105 is formed.

This fabrication method can flexibly deal with various waveguide shapes and can therefore have extremely wide applicability. This method is the most realistic when a semiconductor laser has a mesa body that is relatively high and is buried by a high-resistance semiconductor layer (here, a semi-insulting InP layer), which is suitable for high-speed operation, as shown in FIG. 6.

Japanese Patent Laid-Open No. HEI 8-172241 and Japanese Patent Laid-Open No. 2002-134842 concern buried heterostructure semiconductor lasers configured by AlGaInAs based materials.

SUMMARY OF THE INVENTION

A conventional buried heterostructure semiconductor laser shown in FIG. 6 has an active layer made from an AlGaInAs based material(s), but the lower cladding layer, the upper cladding layer and the semiconductor substrate in the same semiconductor laser are configured by InP. Consequently, when the burying layer is re-grown on the opposite sides of the optical waveguide in a mesa structure to bury the mesa structure, arsenic (As) of a group V element is exposed on the side faces of the active layer and conversely phosphorous (P) of another group V element is exposed on the side faces of the upper and lower cladding layers and on the surface of the semiconductor substrate.

In this case, during a temperature raising step, included in a re-growing step (a burying and re-growing step) of the burying layer, in which a temperature is raised to a crystal growth temperature, it is difficult to generate, in the crystal growth chamber, an atmosphere which is able to prevent evaporating of group V elements (As, P) from all of the exposed surface.

In order to prevent evaporating of P that is higher in vapor pressure than As, the temperature raising step is generally carried out in a state where the inside of the crystal growth chamber is made into a phosphine ($PH_3$) atmosphere.

However, when the side face of the active layer made of an AlGaInAs based material(s) is exposed to a $PH_3$ atmosphere which does not contain As at a high temperature (e.g., 600° C.), As/P replacement occurs despite lower vapor pressure of As than P, resulting in a crystalline defect at the boundary interface between the re-grown burying layer and the active layer. Such crystalline defects lead to an increase in driving electric current (operating electric current). Further, electric current application deteriorates the crystal and reliability may be reduced.

With the foregoing problems in view, an object of the present invention is to provide an optical semiconductor device and a fabrication method of the optical semiconductor device in which As/P replacement does not occur at the boundary interface of a re-grown semiconductor layer and which does not cause a resultant crystalline defect.

In order to attain the object, as the first generic feature of the present invention, there is provided an optical semiconductor device comprising: a semiconductor substrate; a striped stacking body formed by sequentially depositing a first semiconductor layer, an active layer, and a second semiconductor layer; and a burying layer burying the striped stacking body, wherein surfaces in contact with a side face and a bottom face of the burying layer are made of a compound semiconductor that contains arsenic (As) alone as a group V element, and a portion other than the surface includes a group V element other than arsenic.

As a second generic feature, there is provided a method for fabricating an optical semiconductor device, comprising the steps of: (a) depositing a first semiconductor layer, an active layer, and a second semiconductor layer each of which is formed by a compound semiconductor that contains arsenic (As) alone as a group V element by crystal growth; (b) forming a striped stacking body by processing the first semiconductor layer, the active layer and the second semiconductor layer into a mesa shape such that a part of the first semiconductor layer remains on a surface of the semiconductor substrate (c) raising a temperature to a crystal growth temperature in an atmosphere which includes arsenic, and then carrying out crystal growth to form a burying layer such that the burying layer buries the striped stacking body.

As a result, the optical semiconductor device and the fabrication method according to the present invention makes it possible to avoid As/P replacement at the boundary interface of the re-grown semiconductor layer and to generate no crystalline defect caused by the replacement, so that increasing an operating electric current can be advantageously prevented and also crystalline defect caused by electric current application can be prevented from occurring. Therefore, reliability of the optical semiconductor device of the present invention can be improve. Additionally, it is possible to reduce a ratio of devices which are high in operating electric current and also a ratio of devices which are large in deterioration caused by electric current application so that fabrication yield increases.

Other objects and further features of the present invention will be apparent from the following detailed description when read in conjunction with the accompanying drawings.

BRIEF DESCRIPTION OF THE DRAWINGS

FIGS. 2(A)-2(F) are schematic sectional views showing a fabrication method of the optical semiconductor device of FIG. 1;

FIGS. 4(A)-4(F) are schematic sectional views showing a fabrication method of the optical semiconductor device of FIG. 3;

DESCRIPTION OF THE PREFERRED EMBODIMENTS

Various embodiments of an optical semiconductor device and a fabrication method thereof of the present invention will now be described with reference to accompanying drawings.

(A) First Embodiment

An optical semiconductor device and a fabrication method thereof according to the first embodiment will now be described with reference to FIGS. 1 and 2.

An optical semiconductor device according to the first embodiment is exemplified by a semiconductor laser (a semiconductor light emitting device) including an active layer (such as an AlGaInAs based active layer) made of a compound semiconductor containing arsenic (hereinafter referred to as As) alone as a group V element, and adopts a Semi-Insulating Buried Heterostructure (SI-BH structure) serving as a current blocking (confined) structure.

Figure 1:
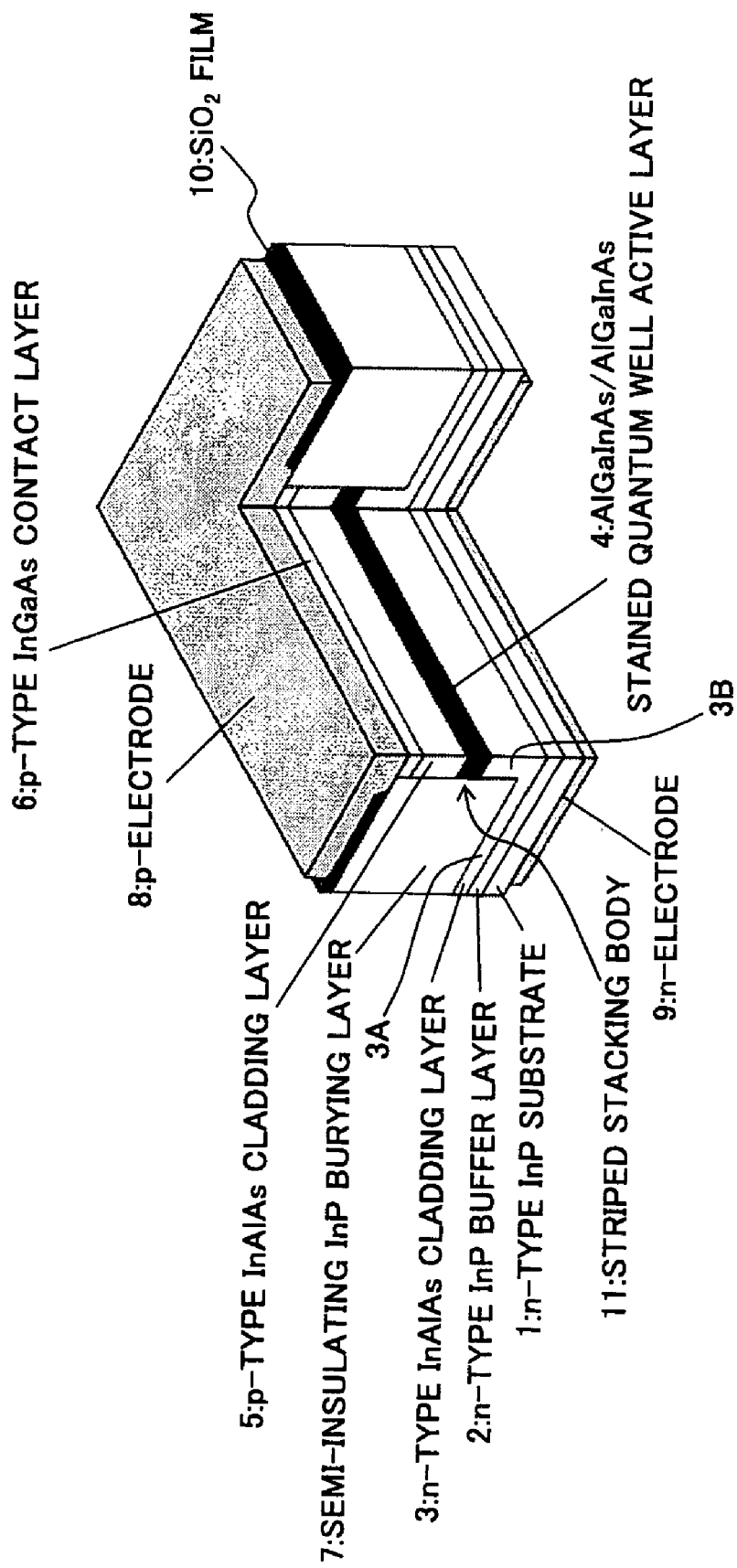
FIG. 1 is a perspective view schematically illustrating an optical semiconductor device according to the first embodiment of the present invention.

Namely, the semiconductor laser includes an n-type InP buffer layer 2 (having a thickness of 0.5 µm), an n-type InAlAs cladding layer 3 (a first semiconductor layer, a lower cladding layer), an AlGaInAs/AlGaInAs strained multiple quantum well active layer 4 (a waveguide core layer) having a strained multiple quantum well structure made of a compound semiconductor containing AlGaInAs based compositions (including AlGaInAs, InAlAs, InGaAs), a p-type InAlAs cladding layer 5 (a second semiconductor layer, an upper cladding layer), a p-type InGaAs contact layer 6, a semi-insulating InP burying layer 7 (a current blocking layer, a high-resistance semiconductor layer), and a p-electrode 8, an n-electrode 9 and an $SiO_2$ film (an insulating film) 10 that are formed on an n-type InP substrate 1 (an n-InP substrate, a semiconductor substrate), as shown in FIG. 1.

The strained multiple quantum well active layer 4 is formed by stacking +1.5% compressive strained AlGaInAs well layers, each of which has a thickness of 4.2 nm, and the AlGaInAs barrier layers, each of which has bandgap wavelength of 1.0 µm and a thickness of 10 nm, ten times alternately. That is, the number of well layers is 10.

The semi-insulating InP burying layer 7 is, for example, an Fe—InP burying layer formed by doping iron (Fe). The p-electrode 8 is formed on the contact layer 6 and is exemplified by a Ti/Pt/Au electrode. The $SiO_2$ film 10 is formed so as to cover the exposing surface of the semiconductor laser. Further, then-electrode 9 is formed on the back face of the n-type InP substrate 1 and is exemplified by an Au/Ge electrode.

For example, the thickness of the n-type InAlAs cladding layer 3 is 0.5 µm, and those of the p-type InAlAs cladding layer 5 and the p-type InGaAs contact layer 6 are 1.7 µm and 0.5 µm, respectively.

In the first embodiment, the lower cladding layer 3 includes a base 3A (here, also functioning as a current blocking layer) which extends close to the end face of the substrate 1 so as to cover the surface of the buffer layer 2 formed on the substrate 1, and a protrusion 3B which sticks out from the base 3A.

Here, the buffer layer 2 may or may not be provided. If the buffer layer 2 is not provided, the base 3A of the lower cladding layer 3 covers the surf ace of the semiconductor substrate 1. Generally, the buffer layer 2 can be considered to serve as a one unit together with the semiconductor substrate 1, and the dominant conception of the wording "semiconductor substrate" includes the semiconductor substrate 1 and the buffer layer 2.

Further, the lower cladding layer 3 of the first embodiment includes the base 3A and the protrusion 3B that are formed integrally; but alternatively, the base 3A and the protrusion 3B may be separated semiconductor layers. For example, a portion corresponding only to the protrusion 3B is regarded as the lower cladding layer (the first semiconductor layer) and a semiconductor layer (sufficiently formed by a compound semiconductor containing As alone as a group V element; the third semiconductor layer, the current blocking layer) corresponding to the base 3A is satisfactorily formed between the above lower cladding layer 3 and the semiconductor substrate 1 (occasionally including the buffer layer). In this case, it is sufficient that the lower cladding layer (the protrusion) is an AlGaInAs layer and the semiconductor layer (the base) is an InAlAs layer, for example.

In this embodiment, the protrusion 3B of the lower cladding layer 3, the active layer 4, the upper cladding layer 5 and the contact layer 6 are sequentially stacked to form into a multilayered structure, so that a striped stacking body (mesa structure) 11 having a mesa structure is formed.

From another viewpoint, the protrusion 3B of the lower cladding layer 3, the active layer 4 and the upper cladding layer 5 are considered to form a stripe (strip) optical waveguide having a mesa structure. Additionally, the mesa structure in this example has a vertical mesa structure whose width is unchanged from the top to the bottom, but should by no means be limited to this. Alternatively, the mesa structure may be an inverted mesa structure which becomes wider towards the top and a normal mesa structure which become narrower towards the top. Further alternatively, the mesa structure may be a combination of the above three types.

As described later, the striped stacking body 11 is fabricated by forming a multilayered structure in which the lower cladding layer 3, the active layer 4, the upper cladding layer 5 and the contact layer 6, on which an electrode (here a p-electrode) is formed, are stacked and etching the multilayered structure into a striped mesa shape, which therefore has a height of a predetermined value (e.g., approximately 3 μm) or larger. In this case, the electrode contacts with the top of the mesa structure which is buried with semi-insulating layer, so that parasitic capacitance of a device can be reduced and high-speed operation can be realized. A striped stacking body 11 having such a high mesa structure is configured to include a thick-film upper cladding layer that is wide in bandgap and low in refractive index. The striped stacking body 11 may or may not include the contact layer 6.

In particular, the lower cladding layer 3, the active layer 4, the upper cladding layer 5 and the contact layer 6 that form the striped stacking body 11 of the first embodiment are an n-type InAlAs layer, an AlGaInAs layer, a p-type InAlAs layer and a p-type InGaAs layer that are made of compound semiconductors having As alone as a group V element, respectively.

In this case, in a re-growing step (a burying and re-growing step) in which a semi-insulating InP burying layer 7 is re-grown on opposite sides of the striped stacking body 11 as the mesa structure so as to bury the striped stacking body 11, the surface and the side faces of the lower cladding layer 3, the side faces of the active layer 4, the surface and the side faces of the upper cladding layer 5, and the side face of the contact layer 6 are exposed to the atmosphere when the temperature of the atmosphere of the crystal growth chamber is raised to the crystal growth temperature (re-growth temperature). Since the exposed surfaces and side faces are made of compound semiconductors (group III-V compound semiconductor) which are the same or different in type and which contain As (arsenic) alone as a group V element (in other words, since the exposed surfaces and faces do not contain phosphorous (P), which is contained in those of a conventional semiconductor laser), the re-growing step (the burying and re-growing step) can be carried out in an atmosphere containing As.

Such a burying manner avoids that the crystal structure is exposed to an atmosphere which contains a different group V element (for example, an arsine ($AsH_3$) atmosphere for an InP semiconductor crystal, and a phosphine ($PH_3$) atmosphere for an AlGaInAs semiconductor crystal) at a high temperature in the re-growing step (the burying and re-growing step) Whereupon As/P replacement can be prevented and defect occurrence can be extremely inhibited. As a result, crystal deterioration due to an increase in driving current and/or current application can be inhibited.

On a device fabricated according to the above manner, surfaces in contact with the side faces and the bottom face of the burying layer 7 are made of a compound semiconductor which contains As (arsenic) alone as a group V element and a portion out of contact with the side and the bottom faces are made of a compound semiconductor which contains a group V element other than arsenic.

In the first embodiment, the faces in contact with the side and the bottom faces of the burying layer 7 are formed by the lower cladding layer 3, the active layer 4, the upper cladding layer 5 and the contact layer 6. If the lower cladding layer 3 is formed only by the protrusion 3B, the faces in contact with the side and the bottom faces of the burying layer 7 are formed by the lower cladding layer 3 (the protrusion 3B), the active layer 4, the upper cladding layer 5, the contact layer 6 and a third semiconductor layer (a current blocking layer).

In the meanwhile, the portion out of contact with the burying layer 7 is formed by the n-type InP substrate 1 and the n-type InP buffer layer 2. Further, as described later, in the case where the lower cladding layer 3, the active layer 4, the upper cladding layer 5, the contact layer 6, and the third semiconductor layer (current blocking layer) if the lower cladding layer 3 is formed only by the protrusion 3B constitute a multilayered structure. And, only layers that form the faces in contact with the side and the bottom face of the burying layer 7 may be formed by a compound semiconductor which contains As (arsenic) alone as a group V element. Also, layers other than the layers forming faces in contact with the side and the bottom face of the burying layer 7 may be included in a portion out of contact with the burying layer 7 and may contain a group V element other than As.

In the first embodiment, the entire of each of the lower cladding layer 3, the active layer 4, the upper cladding layer 5, the contact layer 6, and additionally the third semiconductor layer (the current blocking layer) if the lower cladding layer 3 is formed only by the protrusion 3B is configured by a compound semiconductor which contains As (arsenic) alone as a group V element so that the faces in contact with the side and the bottom face of the burying layer 7 are made of a compound semiconductor which contains As (arsenic) alone as a group V element. But each layer should by no means be formed by such a compound semiconductor.

For example, the lower cladding layer 3, the active layer 4, the upper cladding layer 5, the contact layer 6, and additionally the third semiconductor layer (the current blocking layer) if the lower cladding layer 3 may be formed only by the protrusion 3B constitute a multilayered structure which has a plurality of layers in the direction that extends from the surface to the inside; for example, two-layered structure), and only layers, in the multilayered structure, that are in contact with the side and the bottom face of the burying layer 7 may be configured by a compound semiconductor which contains As (arsenic) alone as a group V element.

If each of the lower cladding layer 3, the active layer 4, the upper cladding layer 5 and the contact layer 6, and additionally the third semiconductor layer (the current blocking layer) if the lower cladding layer 3 may be formed only by the protrusion 3B is made of a compound semiconductor material which contains As (arsenic) alone as a group V element, each layer may not be made of a single composition but may have a multilayered structure (having a plurality of layers stacked in the thickness direction) formed by layers different in composition or by compositionally graded layers whose compositions continuously change.

In particular, since the base 3A of the n-type InAlAs lower cladding layer 3 extends to the vicinity of the end faces of the semiconductor substrate 1 so as to cover the surface of the buffer layer 2 formed on the semiconductor substrate 1, the side face of the p-type InAlAs cladding layer 5 and the side face of the semi-insulating InP burying layer 7 make a heterojunction and additionally the bottom surface of the semi-insulating InP burying layer 7 and the surface of the n-type InAlAs lower cladding layer 3 make a hetero-junction. Namely, two hetero-junctions that are a barrier to electrons and positive holes are made on a path of the p-type InAlAs cladding layer 5—the semi-insulating InP burying layer 7—the n-type InAlAs lower cladding layer 3, through which path leaking electric current flows.

For this reason, it is more difficult for electric current to flow the leaking current path of the p-type InAlAs cladding layer 5—the semi-insulating InP burying layer 7—the n-type InAlAs lower cladding layer 3 than the current path of the p-type InAlAs cladding layer 5—the AlGaInAs active layer 4—the n-type InAlAs cladding layer 3, so that leaking electric current can be reduced as compared to a conventional semi-insulating buried heterostructure (SI-BH structure).

In the illustrated example, the lower cladding layer 3, the active layer 4, the upper cladding layer 5 and the contact layer 6 are an n-type InAlAs layer, an AlGaInAs layer, a p-type InAlAs layer, and a p-type InGaAs layer, respectively but should by no means be limited to these. Each of the lower cladding layer 3, the active layer 4, the upper cladding layer 5 and the contact layer 6 is satisfactory made of a compound semiconductor which contains As (arsenic) alone as a group V element.

A compound semiconductor that contains arsenic alone as a group V element is exemplified by a compound semiconductor expressed by a composition formula $Al_xGa_yIn_{1-x-y}As$ ($0 \leq x \leq 1$, $0 \leq y \leq 1$), a TlGaInAs based compound semiconductor(s) containing Tl (thallium), or a GaInMnAs based compound semiconductor(s) containing Mn (Manganese).

Above all, it is preferable that the quaternary compound semiconductor expressed by $Al_xGa_yIn_{1-x-y}As$ ($0 \leq x \leq 1$, $0 \leq y \leq 1$) can be materials being different in bandgap and being in the state of lattice matching to the InP substrate by varying a ratio of Al and Ga with an In composition constant.

Generally, a requirement for lattice matching to the InP substrate is setting x and y to satisfy the equation $x=0.477-1.020y$. If $x=0$, i.e., $Ga_{0.47}In_{0.53}As$ or $y=0$, i.e., $Al_{0.48}In_{0.52}As$, the compound semiconductor is considered to have the same lattice constant as InP. If the layer is a thin film such as a quantum well layer or a barrier layer, compresssive strain or tensile strain can be introduced to the thin film by intentionally shifting the values of x and y from the above lattice matching requirement. Therefore, the well layer of the first embodiment has compressive strain as described above.

Description will now be made in relation to a fabrication method of a semiconductor laser serving as the optical semiconductor device according to the first embodiment with reference FIGS. 2(A)-2(F).

First of all, as shown in FIG. 2(A), the n-type InP buffer layer 2, the n-type InAlAs cladding layer 3 (the first semiconductor layer, the lower cladding layer), the AlGaInAs/AlGaInAs strained multiple quantum well active layer 4 (the waveguide core layer) which has a strained multiple quantum well structure and which is made of an AlGaInAs based compound semiconductor(s), the p-type InAlAs cladding layer 5 (the second semiconductor layer, the upper cladding layer) and the p-type InGaAs contact layer 6 are sequentially grown on the n-type InP substrate 1 by, for example, an MOVPE (Metal Organic Vapor Phase Epitaxy) method so that a semiconductor stacking body having a layered structure is formed.

Next, an $SiO_2$ mask 12 serving as a etching mask is formed on the semiconductor stacking body, as shown in FIG. 2(B). The $SiO_2$ mask 12 takes a shape of a stripe having a width of 1.8 μm, for example, formed by means of a normal lithography technique.

Then, as shown in FIG. 2(C), dry etching using chlorine, for example, as an etching gas is performed by using the $SiO_2$ mask 12 to form the striped stacking body 11 (a mesa structure) having a mesa structure which has a predetermined height (e.g., 2.7 μm) or larger and in which a part of the lower cladding layer 3 formed below the active layer 4 remains, as a result of mesa processing, on the buffer layer 2 formed on the semiconductor layer 1. Here, the thickness of the lower cladding layer 3 remaining on the buffer layer 2 as the result of the mesa etching can take an arbitrary value as long as the remaining lower cladding layer 3 covers at least the surface of the buffer layer 2.

In this case, the exposed surfaces of the device are formed by the surface and the side faces of the n-type InAlAs cladding layer 3, the side faces of the AlGaInAs/AlGaInAs strained multiple quantum well active layer 4, the side faces of the p-type InAlAs cladding layer 5, and the side faces of the p-type InGaAs contact layer 6, each of which is made of a compound semiconductor (III-V group compound semiconductor) that contains arsenic alone as a group V element (in other words, no face containing phosphorus, differently from a conventional layered formation).

In the first embodiment, it is preferable that the mesa structure is formed by dry etching that forms a flat bottom surface so that the buffer layer 2 is not exposed. But alternatively, it is possible to previously form the lower cladding layer 3 to be thick and then form the mesa structure by wet etching.

In succession, a damaged layer formed on the surface of the mesa is removed by carrying out wet etching with a hydrobromic acid based solution thinly and immersing in an ammonium sulfide solution. After that, the striped stacking body is put into a crystal growth chamber, and the semi-insulating InP burying layer 7 is re-grown by the MOVPE method in such a manner that opposite sides of the striped stacking body 11 (mesa structure) having a mesa structure are buried (the re-growing step, the burying and re-growing step).

More specifically, the re-growing step (the burying and re-growing step) begins with providing a crystal growth chamber with $AsH_3$ of a group V element gas to create an $AsH_3$ atmosphere in which the temperature is raised to a re-growth temperature (e.g., 600° C.) (the temperature raising step).

In this case, since all the exposed surfaces of the device contain arsenic alone as a group V element and the temperature raising step is performed in the $AsH_3$ atmosphere, the crystal surface is not exposed to an atmosphere which contains a different group V element at a high temperature and consequently As/P replacement does not occur, so that defect occurrence can be extremely inhibited. As a result, crystal deterioration due to an increase in driving current and/or current application can be inhibited.

After inside the crystal growth chamber is heated to the re-growth temperature and the temperature becomes stable, the semi-insulating InP burying layer 7 is re-grown so as to bury opposite sides of the striped stacking body 11 having a mesa structure as shown in FIG. 2(D) with, for example, MOVPE method by switching the group V gas from $AsH_3$ to $PH_3$ and providing TMI (trimethyl indium) as a group III gas to the crystal growth chamber.

Then the $SiO_2$ mask 12 is removed as shown in FIG. 2(E).

After that, an $SiO_2$ film 10 (an insulating film) is formed to cover the entire surface as shown in FIG. 2(F). From a portion on and upwardly near to the contact layer, the $SiO_2$ film 10 is removed and the p-electrode 8 made of, for example Ti/Pt/Au on the portion is formed. Meanwhile, on the back face of the n-type InP substrate 1, the n-electrode 9 made of, for example, AuGe is formed.

As a result, the optical semiconductor device and the fabrication method thereof according to the first embodiment can avoid the occurrence of As/P replacement at the boundary interface of the re-grown semiconductor layer (the burying layer 7) and can therefore reduce crystalline defect occurrence with an advantageous result that an operating current is prevented from becoming high. Further, crystal deterioration due to current application can be avoided and the reliability of the device can therefore be enhanced. Still further, the device and the fabrication method can reduce a ratio of devices with a high operating current and also a ratio of devices with large deterioration due to current application, so that fabrication yield increases.

(B) Second Embodiment

The optical semiconductor device and the fabrication method thereof according to the second embodiment will now be described with reference to FIGS. 3 and 4.

The optical semiconductor device (a semiconductor laser) of the second embodiment is different from that of the first embodiment in the points that a striped stacking body with a mesa structure is low in height and the device has a buried heterostructure (BH structure) using an npnp thyristor structure functioning as a current blocking structure.

Figure 3:
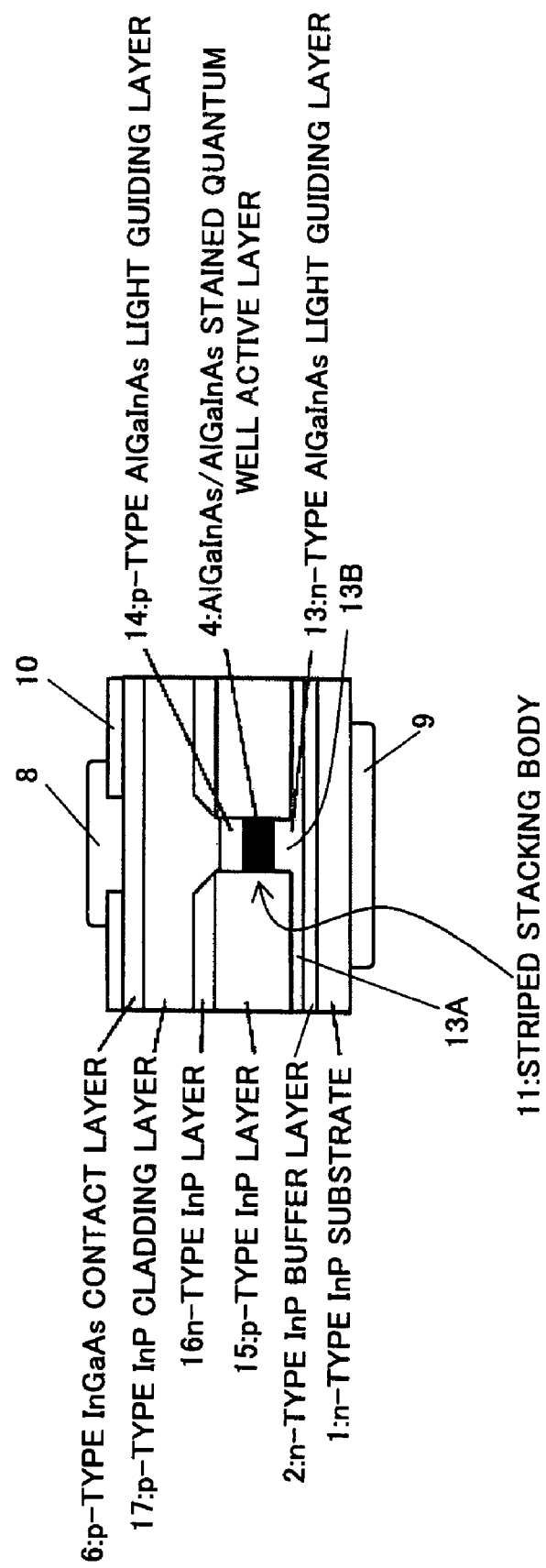
FIG. 3 is a sectional view schematically illustrating an optical semiconductor device according to the second embodiment of the present invention.

The semiconductor laser includes an n-type InP buffer layer 2 also serving as a part of the lower cladding layer, an n-type AlGaInAs lower light guiding layer 13 (a first semiconductor layer), an AlGaInAs/AlGaInAs strained multiple quantum well active layer 4 (a waveguide core layer) having a strained multiple quantum well structure made of a compound semiconductor containing AlGaInAs based compositions (including AlGaInAs, InAlAs, InGaAs), a p-type AlGaInAs upper light guiding layer 14 (second semiconductor layer), a p-type InP burying layer 15, an n-type InP burying layer 16, a p-type InP upper cladding layer 17, a p-type InGaAs contact layer 6, a p-electrode 8, an n-electrode 9 and $SiO_2$ film (insulating layer) 10 that are formed on an n-type InP substrate 1 (an n-InP substrate, a semiconductor substrate) as shown in FIG. 3. The same reference numbers designate similar parts and elements in FIGS. 1 and 3.

The device of the second embodiment forms light guiding layers (each having the bandgap wavelength of 0.95 μm), each of which is made of an AlGaInAs based compound the active layer 4.

The lower light guiding layer 13 includes a base 13A (forms apart of the current blocking structure) which extends to the vicinity of the end face of the n-type InP substrate 1 such that the base 13A covers the surface of the n-type InP buffer layer 2 formed on the n-type InP substrate 1, and a protrusion 13B which sticks out from the base 13A. The base 13A on the final product may be partly removed as required.

Here, the buffer layer 2 may or may not be provided. If the buffer layer 2 is not provided, the base 13A of the lower light guiding layer 13 covers the surface of the semiconductor substrate 1. Generally, the buffer layer 2 can be considered to serve as a part of the semiconductor substrate 1, and the dominant conception of the wording "semiconductor substrate" includes the semiconductor substrate 1 and the buffer layer 2.

Further, the lower light guiding layer 13 of the second embodiment includes the base 13A and the protrusion 13B that are formed integrally; but alternatively, the base 13A and the protrusion 13B may be separated semiconductor layers. For example, a portion corresponding only to the protrusion 13B is regarded as the lower light guiding layer (the first semiconductor layer) and a semiconductor layer (sufficiently formed by a compound semiconductor which contains As alone as a group V element) corresponding to the base 13A is satisfactorily formed between the above lower light guiding layer and the semiconductor substrate 1 (occasionally including the buffer layer). In this case, it is sufficient that the lower light guiding layer (the protrusion) is an AlGaInAs layer and the semiconductor layer (the base) is an InAlAs layer, for example.

In this embodiment, the protrusion 13B of the lower light guiding layer 13, the active layer 4, and the upper light guiding layer 14 are sequentially stacked to form into a multilayered structure, so that a striped stacking body (mesa structure) 11 having a mesa structure is formed. From another viewpoint, the protrusion 13B of the lower light guiding layer 13, the active layer 4 and the upper light guiding layer 14 are considered to form a stripe (strip) waveguide having a mesa structure.

The striped stacking body 11 with a mesa structure of the second embodiment does not include an upper cladding layer formed by a thick film and a contact layer and therefore is in a mesa structure having a height lower than the predetermined value. In the case where the optical semiconductor device has the striped stacking body 11 with a mesa structure that is relatively low in height, the striped stacking body 11 is buried with the p-type InP burying layer 15 and the n-type InP burying layer 16 and then a thick upper cladding layer (i.e., the p-type InP upper cladding 17) with a wide bandgap and a low refractive index is formed to cover the entire surface.

In particular, the lower light guiding layer 13, the active layer 4, and the upper light guiding layer 14 that constitute the striped stacking body 11 of the second embodiment are an n-type AlGaInAs layer, an AlGaInAs layer, and a p-type AlGaInAs layer that are made of compound semiconductors containing As alone as a group V element, respectively.

In this case, in a re-growing step (a burying and re-growing step) in which the p-type InP burying layer 15 and the n-type InP burying layer 16 are re-grown on opposite sides of the striped stacking body 11 so as to bury the striped stacking body 11, when the temperature is raised to the crystal growth temperature (re-growth temperature), the surface and the side faces of the lower light guiding layer 13, the side faces of the active layer 4, and the side faces of the upper light guiding layer 14 are exposed to the atmosphere in the crystal growth chamber. Since all the exposed surfaces and side faces are made of compound semiconductors (III-V compound semiconductor) which are the same or different in type and which contain As alone as a group V element (in other words, since the exposed surfaces and side faces do not contain phosphorous (P), which is contained in those of a conventional semiconductor laser), the re-growing step (the burying and re-growing step) can be carried out in an atmosphere containing arsenic.

Such a structure avoids that the crystal surface is exposed to an atmosphere which contains a different group V element at a high temperature in the re-growing step (the burying and re-growing step). Whereupon As/P replacement can be prevented and defect occurrence can be greatly inhibited. As a result, crystal deterioration due to an increase in driving current and/or current application can be inhibited.

On the device fabricated according to the above manner, the faces in contact with the side and the bottom faces of the burying layer 15 are made of a compound semiconductor (groups III-V semiconductor) whose group V element is only arsenic; and the faces out of contact with the burying layer 15 is made of a compound semiconductor including a group V element other than arsenic.

Here, faces in contact with the side and the bottom faces of the burying layer 15 are formed by a lower light guiding layer 13, the active layer 4 and the upper light guide layer 14. If the lower light guiding layer 13 is formed only by the protrusion 13B, the side and the bottom faces of the burying layer 15 are formed by the lower light guiding layer 13 (the protrusion 13B), the active layer 4, the upper light guiding layer 14, and the third semiconductor layer.

The portion out of contact with the burying layer 15 is formed by the n-type InP substrate 1 and the n-type InP buffer layer 2. Further, as described later, in the case where the lower light guiding layer 13, the active layer 4, the upper light guiding layer 14, and the third semiconductor layer if the lower light guiding layer 13 is formed only by the protrusion 13B constitute a multilayered structure. And, only layers that form the faces in contact with the side and the bottom face of the burying layer 15 are configured by a compound semiconductor whose group V element is only arsenic. Also, layers other than the layers forming faces in contact with the side and the bottom face of the burying layer 15 may include a portion out of contact with the burying layer 15 and may include a group V element other than arsenic.

In the second embodiment, the entire of each of the lower light guiding layer 13, the active layer 4, the upper light guiding layer 14, and additionally the third semiconductor layer (the current blocking layer) is, if the lower light guiding layer 13 is formed only by the protrusion 13B, formed by a compound semiconductor which contains As alone as a group V element so that the faces in contact with the side and the bottom face of the burying layer 15 are made of a compound semiconductor whose group V element is only arsenic. But each layer should by no means be formed by such a compound semiconductor.

For example, the lower light guiding layer 13, the active layer 4, and the upper light guiding layer 14, additionally the third semiconductor layer if the lower light guiding layer 13 may be formed only by the protrusion 13B constitute a multilayered structure which has a plurality of layers in the direction from the surface to the inside; for example, two-layered structure), and only layers, in the multilayered structure, that are in contact with the side and the bottom face of the burying layer 15 may be made of a compound semiconductor which contains As alone as a group V element.

If each of the lower light guiding layer 13, the active layer 4, the upper light guiding layer 14 and additionally the third semiconductor layer if the lower light guiding layer 13 is formed only by the protrusion 13B is made of a compound semiconductor material which contains As alone as a group V element, each layer may not be made of a single composition but may have a multilayered structure (having a plurality of layers stacked in the thickness direction) formed by layers different in composition or by compositionally graded layers whose compositions continuously change.

In particular, since the base 13A of the lower light guiding layer 13 extends to the vicinity of the end faces of the semiconductor substrate 1 so as to cover the surface of the buffer layer 2 formed on the semiconductor substrate 1, the side face of the p-type AlGaInAs upper light guiding layer 14 and the side face of the p-type InP burying layer 15 make a heterojunction and additionally the bottom surface of the p-type InP burying layer 15 and the surface of the n-type AlGaInAs light guiding layer 13 make a hetero-junction. Namely, two hetero-junctions that are a barrier to electrons and positive holes are made on a path of the p-type AlGaInAs upper light guiding layer 14—the p-type InP burying layer 15—the n-type AlGaInAs light guiding layer 13, through which path leaking electric current flows.

For this reason, it is more difficult for an electric current to flow the leaking current through path of the p-type AlGaInAs upper light guiding layer 14—the p-type InP burying layer 15—the n-type AlGaInAs lower light guiding layer 13 than through the current path of the p-type AlGaInAs upper light guiding layer 14—the p-type InP burying layer 15—the n-type AlGaInAs lower light guiding layer 13, so that leaking electric current can be reduced.

In the illustrated example, the lower light guiding layer 13, the active layer 4, and the upper light guiding layer 14 are an n-type AlGaInAs layer, an AlGaInAs layer, a p-type AlGaInAs layer, respectively, but should by no means be limited to these. Each of the lower light guiding layer 13, the active layer 4, and the upper light guiding layer 14 are satisfactorily made of a compound semiconductor that contains arsenic (As) alone as a group V element.

A compound semiconductor that contains arsenic alone as a group V element is exemplified by a compound semiconductor expressed by a composition formula $Al_xGa_yIn_{1-x-y}As$ ($0 \leq x \leq 1$, $0 \leq y \leq 1$), a TlGaInAs based compound semiconductor(s) containing Tl (thallium), or a GaInMnAs based compound semiconductor(s) containing Mn (Manganese).

The details of configuration of the device of the second embodiment are identical to that of the first embodiment, so description is omitted here.

Description will now be made in relation to a fabrication method of a semiconductor laser serving as the optical device according to the second embodiment with reference to FIGS. 4(A)-4(F).

First of all, as shown in FIG. 4(A), the n-type InP buffer layer 2, the n-type AlGaInAs lower light guiding layer 13, the AlGaInAs/AlGaInAs strained multiple quantum well active layer 4 and the p-type AlGaInAs upper light guiding layer 14 are sequentially grown on the n-type InP substrate 1 by, for example, an MOVPE (Metal Organic Vapor Phase Epitaxy) method so that a semiconductor layered formation having a layered structure is formed.

Next, an $SiO_2$ mask 12 serving as a mask for etching is formed on the semiconductor layered formation, as shown in FIG. 4(B). The $SiO_2$ mask 12 takes a shape of a strip formed by means of a normal lithography technique.

Then, as shown in FIG. 4(C), dry etching using chlorine, for example, as an etching gas is performed by using the $SiO_2$ mask 12 to form the striped stacking body 11 (a mesa structure) having a mesa structure which is relatively low in height and in which a part of the lower light guiding layer 13 formed below the active layer 4 remains on the buffer layer 2 formed on the semiconductor layer 1. Here, the thickness of the lower light guiding layer 13 remaining on the buffer layer 2 as the result of the mesa etching can take an arbitrary value as long as the remaining lower light guiding layer 13 covers at least the surface of the buffer layer 2.

In this case, the exposed surfaces of the device are formed by the surface and the side faces of the n-type AlGaInAs lower light guiding layer 13, the side faces of the AlGaInAs/AlGaInAs active layer 4 and the side faces of the p-type AlGaInAs upper light guiding layer 14, each of which is made of a compound semiconductor that contains arsenic alone as a group V element (in other words, no face containing phosphorus differently from a conventional layered formation).

In the present embodiment, it is preferable that the mesa structure is formed by dry etching that forms a flat bottom surface so that the buffer layer 2 is not exposed. But alternatively, it is possible to previously form the lower light guiding layer 13 to be thick and then form the mesa structure by wet etching.

In succession, a damaged layer formed on the surface of the mesa structure is removed by carrying out wet etching with a hydrobromic acid based solution thinly and immersing in an ammonium sulfide solution. After that, the striped stacking body is put into a crystal growth chamber and the p-type InP burying layer 15 and the n-type InP burying layer 16 are re-grown by the MOVPE method in such a manner that opposite sides of the striped stacking body 11 (mesa structure) having a mesa structure are buried (the re-growing step, the burying and re-growing step).

More specifically, the re-growing step (the burying and re-growing step) begins with providing a crystal growth chamber with $AsH_3$ of a group V element gas to create an $AsH_3$ atmosphere, in which the temperature is raised to a re-growth temperature (e.g., 600° C.) (the temperature raising step).

In this case, since all the exposed surfaces of the device contain arsenic alone as a group V element and the temperature raising step is performed in the $AsH_3$ atmosphere, the crystal surface is not exposed to an atmosphere which contains a different group V element at a high temperature and consequently As/P replacement does not occur, so that defect occurrence can be extremely inhibited. As a result, crystal deterioration due to an increase in driving current and/or current application can be inhibited.

After inside the crystal growth chamber is heated to the re-growth temperature and the temperature becomes stable, the P-type InP burying layer 15 and n-type InP burying layer 16 are sequentially re-grown so as to bury opposite sides of the striped stacking body 11 having a mesa structure as shown in FIG. 4(D) with, for example, MOVPE method by switching the group V gas from $AsH_3$ to $PH_3$ and providing TMI (trimethyl indium) as a group III gas to the crystal growth chamber.

After carrying out the re-growing step (the burying and re-growing step) in the above manner, the $SiO_2$ mask 12 is removed and the p-type InP upper cladding layer 17 and p-type InGaAs contact layer 6 are sequentially grown so as to form on the entire surface of the p-type AlGaInAs upper light guiding layer 14 and n-type InP burying layer 16 by, for example, the MOVPE method, as shown in FIG. 4(E).

After that, an $SiO_2$ film 10 (an insulating film) is formed to cover the entire surface as shown in FIG. 4(F). From a portion on the contact layer 6, the $SiO_2$ film 10 is removed and form the p-electrode 8 made of, for example Ti/Pt/Au on the portion is formed. Meanwhile, on the back face of the n-type InP substrate 1, the n-electrode 9 made of, for example, AuGe.

As described above, in the second embodiment, the first crystal growth is finished when the p-type AlGaInAs upper light guiding layer 14 is formed, and subsequently mesa processing is carried out in order to form the striped stacking body 11. Re-growing takes place to form the P-type InP burying layer 15 and n-type InP burying layer 16, which bury the striped stacking body 11, and then the P-type upper cladding layer 17 and the p-type InGaAs contact layer are formed to cover the entire surface of the device is formed.

As a result, the optical semiconductor device and the fabrication method thereof according to the second embodiment can avoid the occurrence of As/P replacement at the boundary face of the re-grown semiconductor layer (the burying layer 15) and can therefore reduce crystalline defect occurrence with an advantageous result that an operating current is prevented from becoming high. Further, crystal deterioration due to current application can be avoided and the reliability of the device can therefore be enhanced. Still further, the device and the fabrication method can reduce a ratio of devices with a high operating current and also a ratio of devices with large deterioration due to current application, so that fabrication yield increases.

(C) Others

In the foregoing embodiments, temperature is raised to the re-growing temperature in an $AsH_3$ atmosphere, to which an atmosphere should by no means be limited to. Alternatively, temperature may be satisfactorily raised to the re-growth temperature in an atmosphere containing arsenic (As). In order to generate an atmosphere containing arsenic, it is sufficient to provide the crystal growth chamber with a gas (a group V material gas) that produces As by thermal decomposition at the re-growth temperature (e.g., 600° C.). For example, an atmosphere containing arsenic is generated by providing the chamber with TBA (tertiary butyl arsenic)

The first and the second embodiments are described exemplifying a Fabry-Perot semiconductor laser that includes no diffraction grating layer. But, the optical semiconductor device of the present invention should by no means be limited to such a semiconductor laser. Alternatively, the present invention can be applied to distributed feed-back lasers and distributed Bragg reflector lasers that have diffraction grating layers. Further, the present invention can be applied also to other devices such as a semiconductor modulator identical in structure to the semiconductor laser of the first and the second embodiments and to a semiconductor laser integrating a semiconductor modulator.

The above two embodiments are detailed exemplifying a semiconductor laser formed on an n-type InP substrate (a first conductive semiconductor substrate). But, the present invention should by no means be limited to this example. Semiconductor lasers of the present invention may be alternatively formed on p-type InP substrates (a second conductive semiconductor substrates) or on high-resistance InP substrates (SI-InP substrates) Further alternatively, semiconductor lasers of the present invention may be formed on substrates made of semiconductor materials other than InP. For example, the present invention can be applied on a semiconductor laser with a GaInP lower cladding layer formed on a GaAs substrate.

Figure 5:
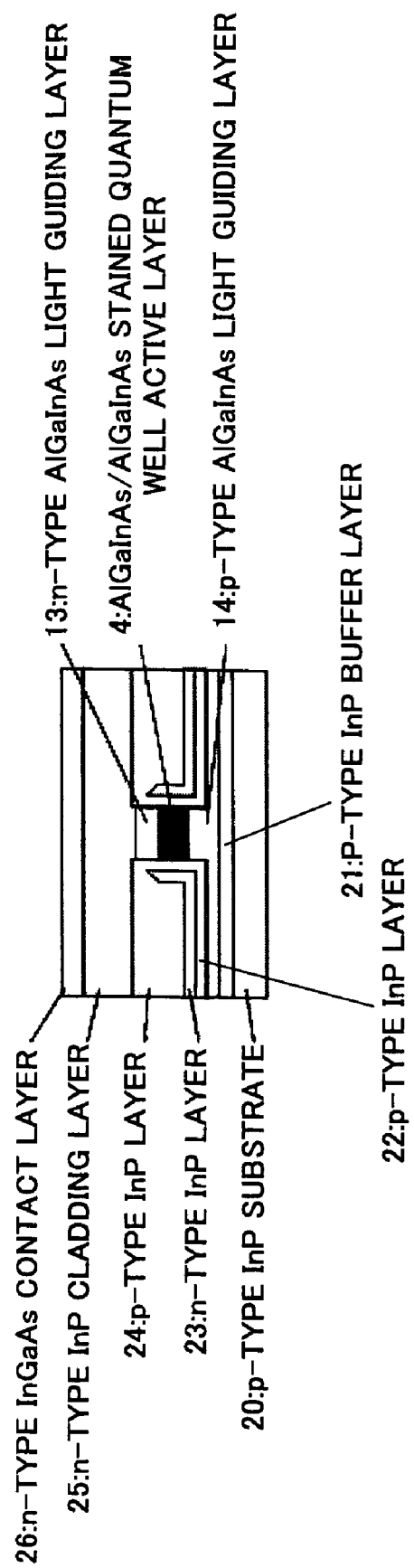
FIG. 5 is a sectional view schematically illustrating a modification of the optical semiconductor device of FIG. 3.
Figure 6:
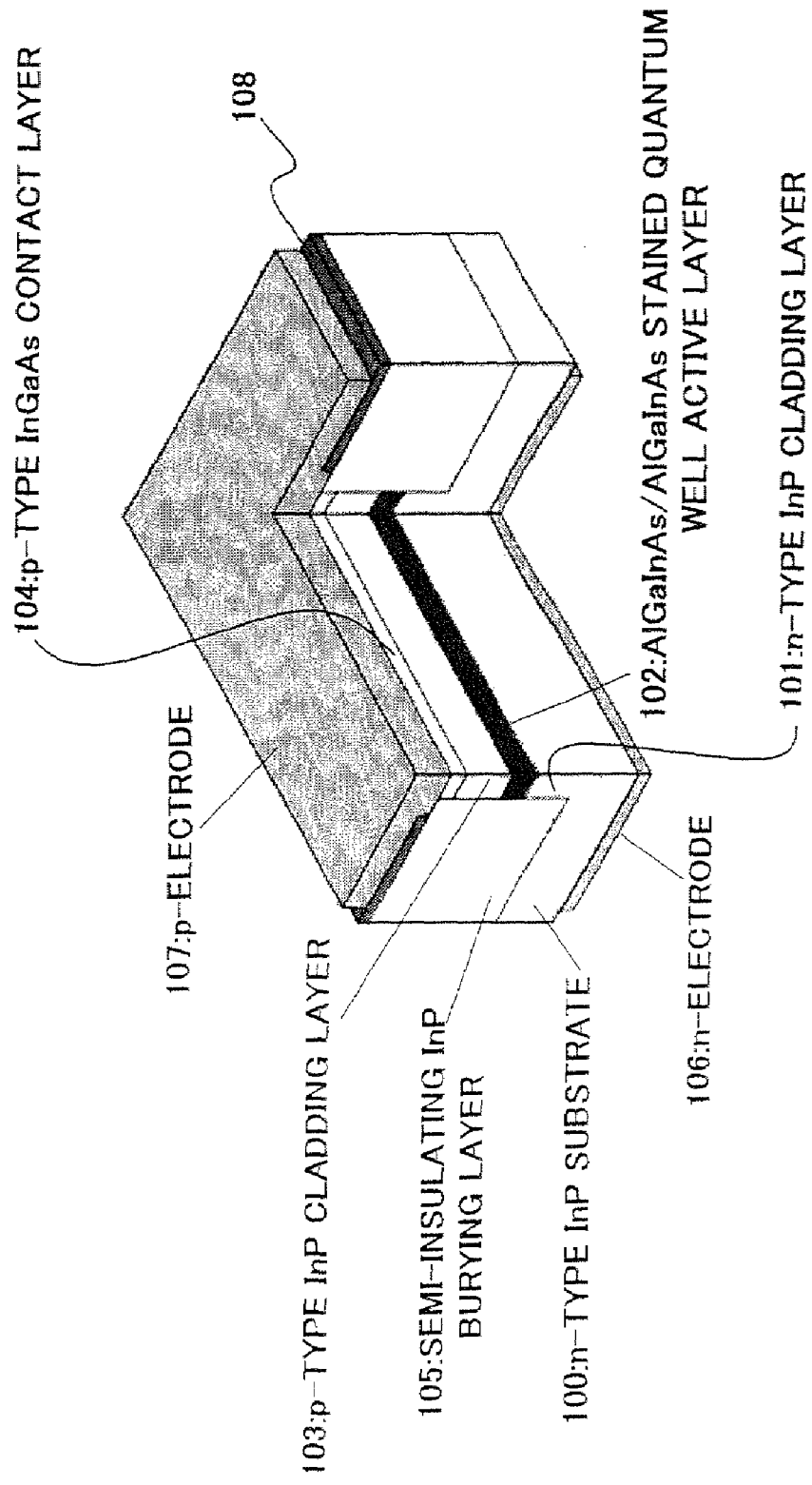
FIG. 6 is a perspective view schematically illustrating a conventional buried heterostructure semiconductor laser made from AlGaInAs based materials.
Figure 7A:
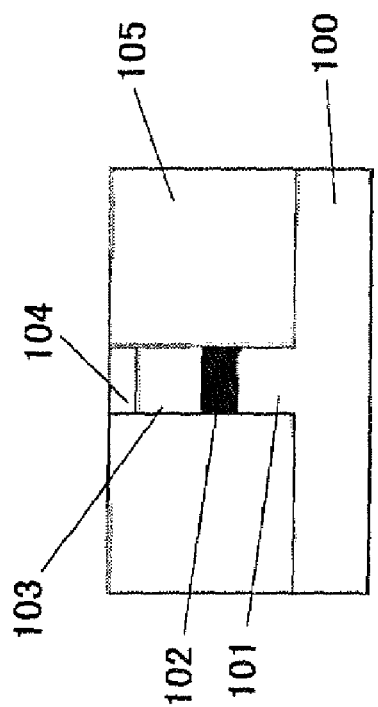
FIGS. 7(A) and 7(B) are sectional views showing a fabrication method of a conventional buried heterostructure semiconductor laser made of AlGaInAs based materials.
Figure 7B:
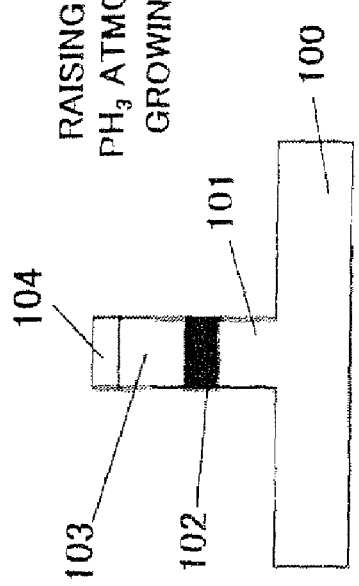

For example, as a modification of the above second embodiment, FIG. 5 illustrates a semiconductor laser formed on a p-type InP substrate. In other words, a semiconductor laser of the modification includes, as shown in FIG. 5, a p-type InP buffer layer 21 also serving as a part of lower cladding layer, a p-type AlGaInAs lower light guiding layer 14 (a first semiconductor layer), an AlGaInAs/AlGaInAs strained multiple quantum well active layer 4 (a waveguide core layer) having a strained multiple quantum well structure made of a compound semiconductor containing AlGaInAs based compositions (including AlGaInAs, InAlAs, InGaAs), an n-type AlGaInAs upper light guiding layer 13 (a second semiconductor layer), a p-type InP burying layer 22, an n-type InP burying layer 23, a p-type InP burying layer 24, an n-type InP upper cladding layer 25 and n-type InGaAs contact layer 26 that are formed on a p-type InP substrate (a semiconductor substrate) 20. The same reference numbers designate similar parts and elements in FIGS. 3 and 5.

In the second embodiment and a modification thereof, burying layers are a p-type InP layer and an n-type InP layer, to which a burying layer should by no means limited. For example, burying layers may be a semi-insulating InP burying layer (a high resistance semiconductor layer, an SI-PBH structure (semi-insulating blocked planer buried heterostructure)) exemplified by an Fe—InP layer. Further, a p-type InP layer or an n-type InP layer may be used for the burying layer of the semiconductor laser of the first embodiment. A burying layer should by no means be limited to those described in the first and the second embodiments and the modification of the second embodiment but is sufficiently configured by a compound semiconductor containing phosphorous (P). For example, the p-type InP layer 15 of the second embodiment may be replaced by a two-layered structure including a p-type InP layer and a p-type InGaAsP layer. In this case, such a two-layered structure is formed by providing TEG (triethyl gallium) along with TMI in the burying step of the above fabrication method.

In the foregoing embodiments, the active layer 4 has an AlGaInAs/AlGaInAs stained multiple quantum well structure, to which however an active layer should by no means be limited. Alternatively, the activating layer 4 may have a multiple quantum well structure of another type, a bulk structure formed by a thick film, a structure with quantum dots (for example, InAs quantum dots or InGaAs quantum dots) or the like.

Further, the present invention should by no means be limited to this foregoing embodiment, and various changes or modifications may be suggested without departing from the gist of the invention.

What is claimed is:

1. An optical semiconductor device comprising:
   a semiconductor substrate;
   a striped stacking body including a first semiconductor layer, an active layer, and a second semiconductor layer; and
   a burying layer burying said striped stacking body,
   wherein surfaces in contact with a side face and a bottom face of said burying layer are made of a compound semiconductor that contains arsenic (As) alone as a group V element, and a portion other than said surface includes a group V element other than arsenic.

2. An optical semiconductor device according to claim 1, wherein:
   said first semiconductor layer includes a base which extends to the vicinity of an end face of said semiconductor substrate and a protrusion which sticks out from said base;
   said striped stacking body includes said protrusion, said active layer and said second semiconductor layer; and
   the surfaces in contact with the side face and the bottom face of said burying layer are configured by said first semiconductor layer, said active layer, and said second semiconductor layer.

3. An optical semiconductor device according to claim 1, further comprising a third semiconductor layer which extends to the vicinity of an end face of said semiconductor substrate, wherein
   said first semiconductor layer is formed on said third semiconductor layer, and
   the surfaces in contact with the side face and the bottom face of said burying layer are configured by said first semiconductor layer, said active layer, said second semiconductor layer, and said third semiconductor layer.

4. An optical semiconductor device according to claim 1, wherein said semiconductor substrate is an InP subs rate.

5. An optical semiconductor device according to claim 1, wherein said active layer is made of an AlGaInAs based compound semiconductor.

6. An optical semiconductor device according to claim 1, wherein each of said first semiconductor layer and said second semiconductor layer is made of an AlGaInAs based compound semiconductor.

7. An optical semiconductor device according to claim 3, wherein each of said first semiconductor layer, said second semiconductor layer, and said third semiconductor layer is made of an AlGaInAs based compound semiconductor.

8. An optical semiconductor device according to claim 1, wherein said burying layer is made of a compound semiconductor including phosphorous (P).

9. An optical semiconductor device according to claim 8, wherein said burying layer is a semi-insulating InP layer.

10. An optical semiconductor device according to claim 8, wherein said burying layer includes an n-type InP layer and a p-type InP layer.

11. An optical semiconductor device according to claim 1, wherein:
    said first semiconductor layer and said second semiconductor layer are cladding layers;
    said striped stacking body is a mesa structure; and
    said optical semiconductor device further comprise an electrode which contacts with a top of the mesa structure.

12. An optical semiconductor device according to claim 11, wherein said striped stacking body includes a contact layer which is made of a GaInAs based compound semiconductor.

13. An optical semiconductor device according to claim 1, further comprising a cladding layer which covers said striped stacking body and said burying layer.

14. An optical semiconductor device according to claim 13, wherein said cladding layer is an InP layer.

15. A method for fabricating an optical semiconductor device, comprising the steps of:
    (a) depositing a first semiconductor layer, an active layer, and a second semiconductor layer each of which is formed by a compound semiconductor that contains arsenic (As) alone as a group V element by crystal growth;
    (b) forming a striped stacking body by processing the first semiconductor layer, the active layer and the second semiconductor layer into a mesa shape such that a part of the first semiconductor layer remains on a surface of the semiconductor substrate;
    (c) raising a temperature to a crystal growth temperature in an atmosphere which includes arsenic, and then carrying out crystal growth to form a burying layer such that the burying layer buries the striped stacking body.

16. A method for fabricating an optical semiconductor device according to claim 15, wherein the temperature is raised to the crystal growth temperature in an arsenic atmosphere or a tertiary butyl arsenic atmosphere, as the atmosphere.

17. A method for fabricating an optical semiconductor device according to claim 15, wherein the temperature is raised to the crystal growth temperature in an arsine atmosphere or a tertiary butyl arsine atmosphere, as the atmosphere, and then an arsine atmosphere or a tertiary butyl arsine atmosphere is replaced with a phosphine atmosphere and trimethyl indium is provided so that an InP burying layer, as the burying layer, is formed by crystal growth.

* * * * *